US 6,584,685 B2

(12) United States Patent
Chung et al.

(10) Patent No.: US 6,584,685 B2
(45) Date of Patent: Jul. 1, 2003

(54) SYSTEM AND METHOD FOR PACKAGE SOCKET WITH EMBEDDED POWER AND GROUND PLANES

(75) Inventors: Chee-Yee Chung, Chandler, AZ (US); David Figueroa, Mesa, AZ (US); Kris Frutschy, Phoenix, AZ (US); Bob Sankman, Chandler, AZ (US); Farzaneh Yahyaei-Moayyed, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/025,257

(22) Filed: Dec. 17, 2001

(65) Prior Publication Data

US 2002/0115313 A1 Aug. 22, 2002

Related U.S. Application Data

(62) Division of application No. 09/751,598, filed on Dec. 29, 2000.

(51) Int. Cl.[7] .............................................. H05K 13/00
(52) U.S. Cl. ......................................................... 29/854
(58) Field of Search .......................... 29/854, 842, 845, 29/825, 830

(56) References Cited

U.S. PATENT DOCUMENTS

| 3,891,898 | A | | 6/1975 | Damon |
| 4,004,196 | A | | 1/1977 | Doucet |
| 4,652,065 | A | | 3/1987 | Cassinelli |
| 4,739,257 | A | | 4/1988 | Jenson et al. |
| 4,747,784 | A | | 5/1988 | Cedrone |
| 4,866,374 | A | | 9/1989 | Cedrone |
| 5,309,324 | A | | 5/1994 | Herandez et al. |
| 5,481,436 | A | * | 1/1996 | Werther |
| 5,634,801 | A | | 6/1997 | Johnson |
| 5,721,673 | A | | 2/1998 | Klein |
| 5,869,961 | A | | 2/1999 | Spinner |
| 5,982,635 | A | | 11/1999 | Menzies et al. |

* cited by examiner

Primary Examiner—Carl J. Arbes
(74) Attorney, Agent, or Firm—Blakely, Sokoloff, Taylor & Zafman LLP

(57) ABSTRACT

A system and method for embedding power and ground planes in a pin grid array (PGA) socket is provided. Integrated circuit pins are inserted into multiple insertion holes of varying dimensions in the power and ground planes. When the cover of the socket is slidably moved, power pins touch the power plane and ground pins touch the ground plane. Decoupling capacitors are also affixed to the substrate. Thus, the power delivery performance of the overall central processing unit (CPU) package is improved. Moreover, the power and ground planes enhance the mechanical strength of the socket which reduces warpage.

9 Claims, 5 Drawing Sheets

| Material | CTE (ppm/C) | Young's modulus (GPa) | modified socket CTE with two 0.4mm thick metal sheets (ppm/C) | CTE mis-match between mod. socket & FR4 board (base=32 ppm/C) |
|---|---|---|---|---|
| FR4 | 16 (in-plane) | 15 (in-plane) | N/A | N/A |
| LCP | 48 (x-flow) | 13 | N/A | N/A |
| copper | 16 | 128 | 17 | 1 |
| stainless steel | 9 | 193 | 10 | 6 |

SYSTEM AND METHOD FOR PACKAGE SOCKET WITH EMBEDDED POWER AND GROUND PLANES

This is a Divisional application of Ser. No. 09/751,598 filed Dec. 29, 2000, which is presently pending.

FIELD OF THE INVENTION

The present invention relates generally to electrical connectors and, more particularly, to a system and method for attaching a pin grid array (PGA) socket with embedded power and ground planes to a printed circuit board.

BACKGROUND

As microprocessor frequencies continue to increase, the assembly of the microelectronic package is taking on greater importance, particularly in the area of power delivery performance and the I/O (signal) performance of the system.

A typical central processing unit (CPU) package includes an integrated circuit (IC) (i.e., a silicon chip) mounted to a substrate with an epoxy-based material. The substrate, in turn, is usually mounted to a large printed circuit board known as a motherboard using a socket or similar type of electrical connector. For instance, certain high-performance computer systems use a pin grid array (PGA) socket. The substrate connects to the PGA socket through metal pins making multiple contacts in a matrix arrangement. The PGA socket and sockets of various other configurations provide versatility to computer systems by allowing integral components, such as microprocessors, to be readily removed for upgrades or repairs. In addition, the PGA socket allows computer manufacturers to decide which version of microprocessor to utilize at the last moment before shipping the product.

Nevertheless, one of the biggest setbacks for socket performance in the overall power delivery network, especially for CPU applications, is the high inductance and resistance of socket pins. The conventional method for improving power delivery performance is by placing decoupling capacitors on the top of the substrate surrounding the IC and by connecting them to internal power and ground distribution planes within the substrate. This method was adequate when IC's were smaller, ran at lower frequencies, and didn't require much power. However, with modem IC's the space from the edge of the IC to the center of the IC introduces noteworthy distributed inductance and resistance which makes external decoupling less effective.

Therefore, it would be advantageous to provide decoupling capacitors in other areas of the CPU package (i.e., the bottom side), thus minimizing the problem of inductance in modern high-speed, high-performance CPU packages.

BRIEF DESCRIPTION OF THE DRAWINGS

The present invention is illustrated by way of example, and not limitation, in the figures of the accompanying drawings in which like reference numerals refer to similar elements and which:

FIG. 7 is a chart of a CTE mismatch calculation between a PGA socket with embedded power and ground planes and a motherboard according to one embodiment of the present invention.

DETAILED DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention. Accordingly, the specification and drawings are to be regarded in an illustrative rather than a restrictive sense.

The current design concept for a typical pin grid array (PGA) socket involves first creating a plastic mold and then inserting individual pin contacts into the plastic mold. Each pin in the socket can be assigned to any functionality depending on its application (i.e., power, ground, or signal). However, in high-speed applications, the inductance and resistance of socket pins create power delivery performance problems to the silicon chip in the overall central processing unit (CPU) package.

A new socket design with the ability to add decoupling capacitors on the socket would improve power delivery performance in the overall CPU package. Because inductance is proportional to the space between power and ground planes, in employing a conventional socket the space between power and ground in the CPU package and the conductive planes in the motherboard, represents the inductive path for power delivery. However, by using a socket with embedded power and ground planes, the space between the power and ground planes in the CPU package to the motherboard is reduced (i.e., with the conductive planes in the socket being an intermediate layer between the conductive planes in the substrate and the motherboard). Moreover, by allowing the embedded power and ground planes in the socket to contact the inserted power and ground pins, the resistance of the entire power supply is also reduced.

Another advantage of the present scheme is that an increase in the mechanical strength (i.e., internal reinforcement) of the socket reduces warpage. It also reduces the coefficient of thermal expansion (CTE) mismatch between the socket and the motherboard. As a result, the terminal height compliance is relaxed which will result in higher socket pin electrical performance.

Figures 1A, 1B:
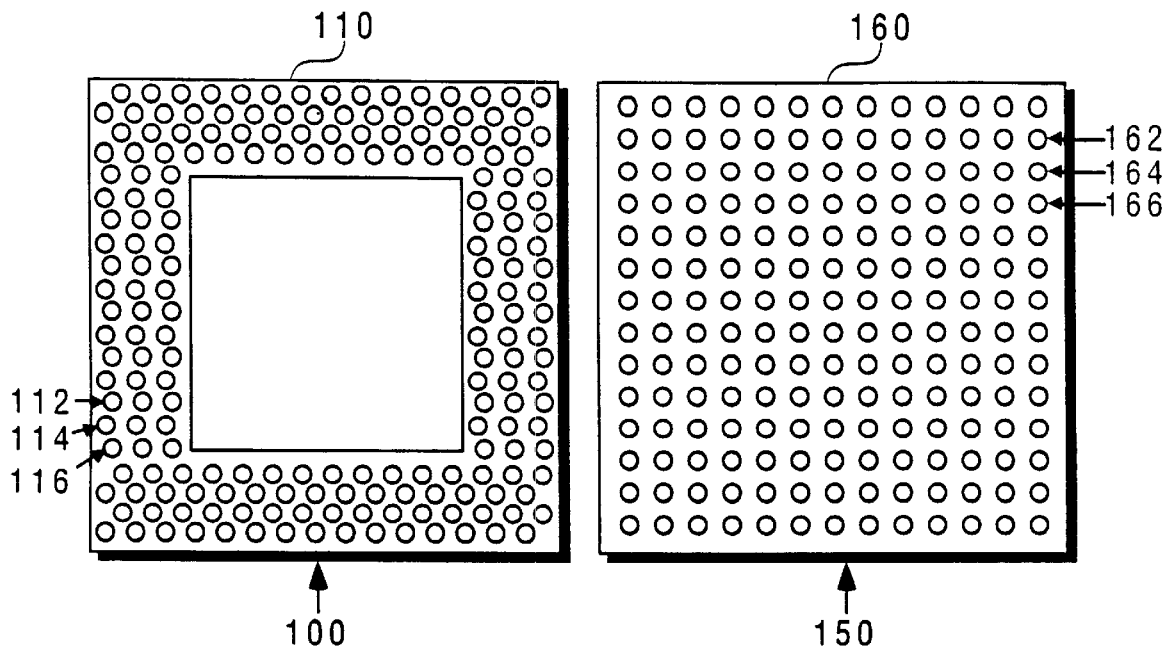
FIG. 1A is a top view of a conventional PGA socket depopulated in the center region.
FIG. 1B is a top view of a conventional fully populated PGA socket.

Referring now to FIG. 1A there is shown a top view of a conventional PGA socket 100. The PGA socket 100 comprises a base that supports multiple contacts (not shown in this view) and a cover 110 comprised of a plastic mold with multiple insertion holes 112, 114, 116, etc., which are generally spaced on 0.1-inch interstitial centers (of course, other pitches are used in the industry including a 0.05 mm pitch). The base is mounted to a motherboard (not shown in this view) to establish an electrical connection with circuits on the motherboard. Pins of an integrated circuit (IC) (not shown in this view) can be forcibly inserted into the insertion holes 112, 114, 116, etc., of the cover 110. Because the pins of the IC may be damaged as a result of the insertion force, zero insertion force (ZIF) PGA sockets have been created to lower the insertion force necessary to establish an electrical interface between the contacts and the pins. Therefore, the cover 110 of the PGA socket 100 (as is typical in most ZIF PGA sockets) is slidably attached to the base so that the cover is movable over the lateral surface of the base. In this manner, the pins inserted into the insertion holes 112, 114, 116, etc., can be moved to form an electrical interface with the contacts.

Referring now to FIG. 1B there is shown a top view of a conventional uPGA socket 150. The uPGA socket 150 is configured in the same manner as the PGA socket 100 of FIG. 1A described above. However, multiple insertion holes 162, 164, 166, etc., on the cover 160 of the socket 150 are arranged in rows to and columns for receiving the pins of the IC (not shown in this view).

Figure 2A:
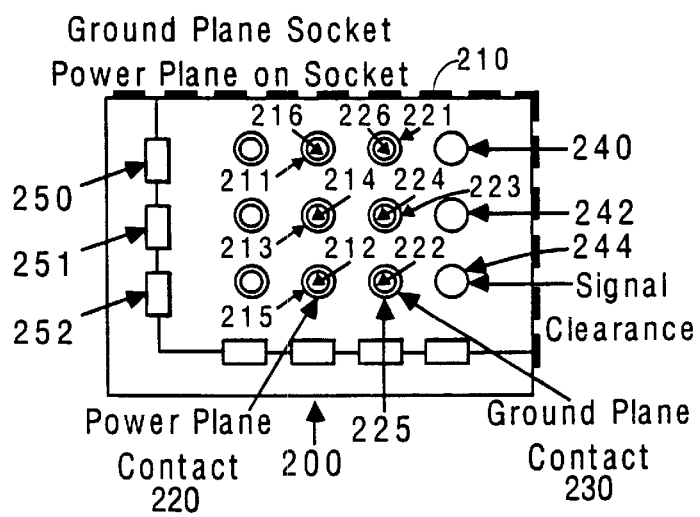
FIG. 2A is a top view of embedded power and ground planes in a PGA socket according to one embodiment of the present invention.

Referring now to FIG. 2A there is shown a top view of embedded power and ground planes in a PGA socket 200 in accordance with one embodiment of the present invention. As in a conventional PGA socket, the PGA socket 200 of the present invention comprises a base that supports multiple contacts (not shown in this view) and a cover 210 slidably attached to the base. The base and the cover 210 are preferably made of a plastic mold or plastic-like material, such as liquid crystal polymer (LCP) or other suitable materials. The cover 210 has multiple insertion holes 212, 214, 216, etc. The base contains corresponding multiple insertion holes, housing spring elements, each of which has a tail portion that extends through corresponding multiple insertion holes in a motherboard (not shown in this view) and are soldered to the motherboard circuitry. The PGA socket 200 may also include further conventional ZIF socket components including a camshaft (not shown in this view) located inside a raised portion of the cover 210. A rotating lever causes the camshaft to act on the base, displacing the cover 210 with respect to the base, which is secured to the motherboard via the tail portions.

In a departure from a conventional ZIF PGA socket, the PGA socket 200 of the present scheme includes an additional design step of placing embedded power and ground planes in the plastic mold or plastic-like material when it forms. Although in the embodiment illustrated by FIG. 2A a single power plane 220 and a single ground plane 230 are shown, it should be appreciated that multiple power and ground planes may be embedded in the plastic mold of the PGA socket 200. Multiple insertion holes 212, 214, 216, etc., in the power plane 220 and corresponding multiple insertion holes 211, 213, 215, etc., in the ground plane 230 are of varying dimensions depending on the application of IC pins (i.e., power, ground, or signal) the multiple insertion holes 211, 212, 213, etc., will be accommodating.

For example, power pins may be inserted through the multiple insertion holes 212, 214, 216, etc., in the power plane 220 and the multiple insertion holes 211, 213, 215, etc., in the ground plane 230 (these holes overlap). However, the multiple insertion holes 212, 214, 216, etc., in the power plane 220 are smaller than the multiple insertion holes 211, 213, 215, etc., in the ground plane 230. Therefore, when the cover 210 of the PGA socket 200 is slidably moved (i.e., displaced approximately 1 mm with respect to the base) the power pins make contact with the power plane 220 but not with the ground plane 230. Similarly, ground pins may be inserted through multiple insertion holes 222, 224, 226, etc., in the power plane 220 and multiple insertion holes 221, 223, 225, etc., in the ground plane 230 where the multiple insertion holes 221, 223, 225, etc., in the ground plane 230 are smaller than those in the power plane 220. When the cover 210 of the socket is slidably moved the ground pins make contact with the ground plane 230 but not with the power plane 220. Multiple insertion holes 240, 242, 244, etc., for signal IC pins are also included in the PGA socket 200. The multiple insertion holes 240, 242, 244, etc., for the signal IC pins may be of varying dimensions, but preferably of a size large enough such that when the cover 210 of the PGA socket 200 is slidably moved, the signal IC pins do not make contact with the edges of the multiple insertion holes 240, 242, 244, etc.

It should be appreciated that various other contact designs between the IC pins and the embedded power plane 220 and ground plane 230 may be accommodated, depending on the amount of contact force required and the amount of insertion allowed for the PGA socket 200. Moreover, the thickness of the power plane 220 and ground plane 230 is not critical (>0.5 mm) but the space between the power plane 220 and ground plane 230 needs to be considerably less than 5 mm's for decoupling capacitors 250, 251, 252, etc., on the PGA socket 200 to be effective in most applications.

Figure 2B:
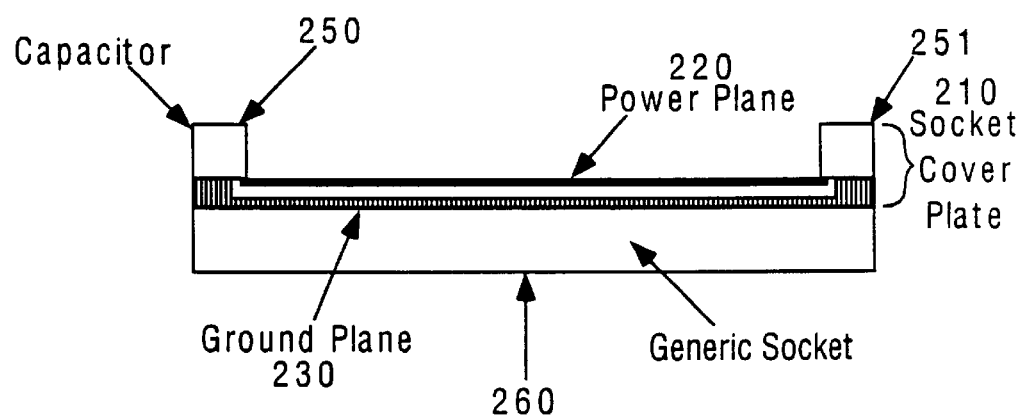
FIG. 2B is a cross-sectional view of embedded power and ground planes in the PGA socket illustrated in FIG. 2A.

Referring now to FIG. 2B there is shown a cross-sectional view of the embedded power and ground planes in the PGA socket 200 of FIG. 2A. In this view, the base 260 of the PGA socket 200 is shown with the cover 210 slidably attached to the base 260. The ground plane 230 is the next layer up from the base 260 and the power plane 220 is at the top of the cover 210. Two of the decoupling capacitors 250 and 251 are also shown.

Figures 3A, 3B:
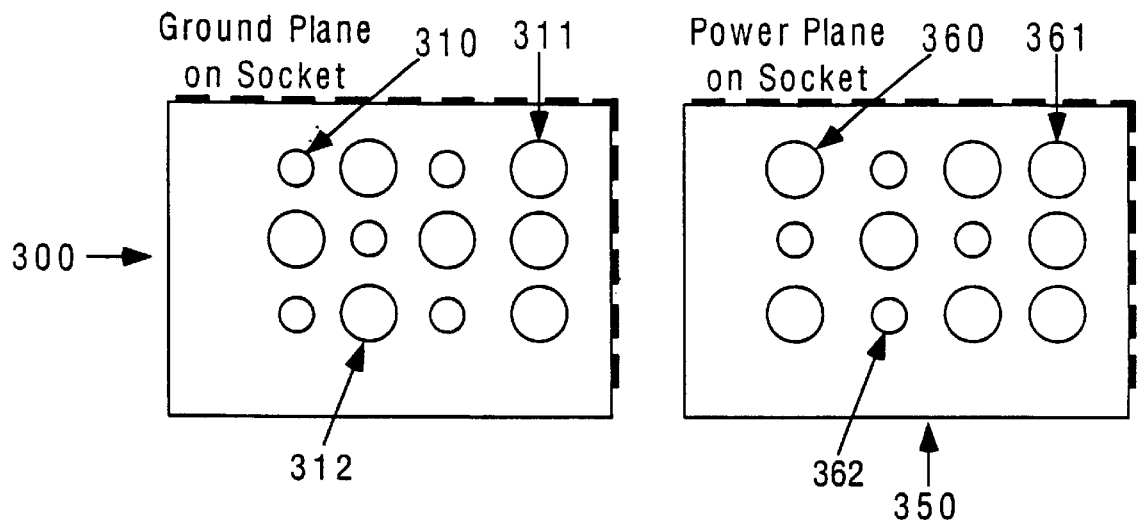
FIG. 3A is a top view of a portion of a ground plane to be embedded in a PGA socket according to one embodiment of the present invention.
FIG. 3B is a top view of a portion of a power plane to be embedded in a PGA socket according to one embodiment of the present invention.

Referring now to FIG. 3A there is shown a top view of a ground plane to be embedded in a PGA socket 300 according to one embodiment of the present invention. The ground plane 300 is fabricated from a conductive metal mesh material such as copper (Cu) or stainless steel. Multiple insertion holes 310, 311, 312, etc., of varying dimensions, are created in the ground plane 300 which is then embedded in the plastic mold of the PGA socket 300 in a manner as is described herein.

Referring now to FIG. 3B there is shown a top view of a power plane to be embedded in a PGA socket 350 according to one embodiment of the present invention. The power plane 350 is fabricated from the same conductive metal mesh material as is described in FIG. 3A. Multiple insertion holes 360, 361, 362, etc., of varying dimensions, correspond to the multiple insertion holes 310, 311, 312 in the ground plane 300 in FIG. 3A. As is described above, the multiple insertion holes 360, 361, 362, etc., in the power plane 350 overlap with the multiple insertion holes 310, 311, 312, etc., in the ground plane 300, with power pins (not shown in this view) inserted in the smaller insertion holes 362, etc., in the power plane 350 (which overlap with larger insertion holes 312, etc., in the ground plane 300) and ground pins (not shown in this view) inserted into smaller insertion holes 310, etc., in the ground plane 300 (which overlap with larger insertion holes 360, etc., in the power plane 350).

Figure 4:
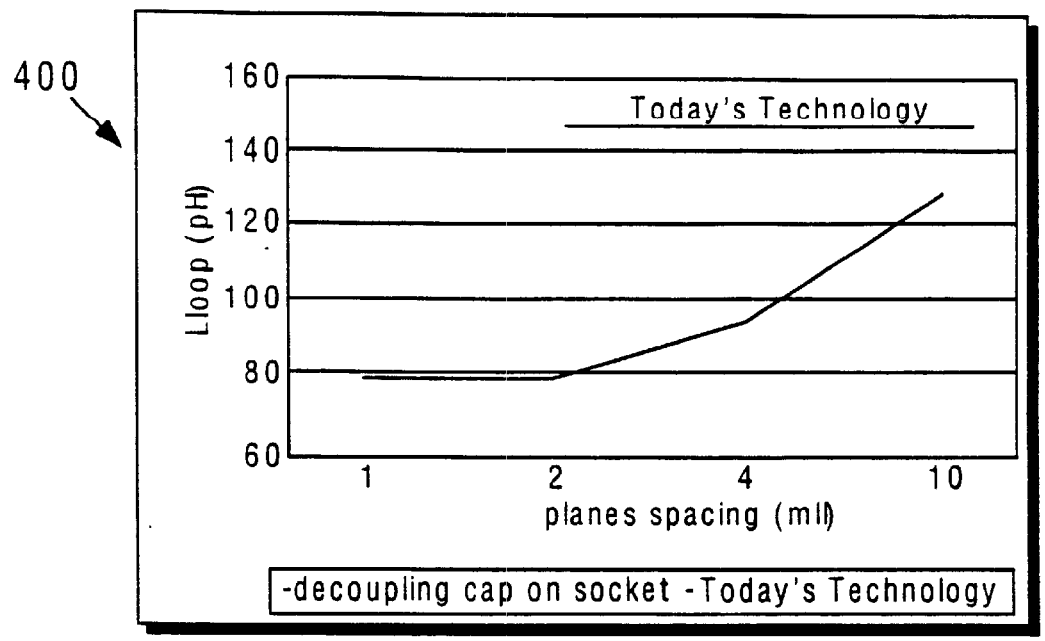
FIG. 4 is a graph showing the reduction in loop inductance for power delivery using a PGA socket with embedded power and ground planes according to one embodiment of the present invention.

Referring now to FIG. 4 there is shown a graph showing the reduction in loop inductance for power delivery using a PGA socket with embedded power and ground planes 400 according to one embodiment of the present invention. The introduction of the metal mesh described above effectively functions as vertical ground planes for the PGA socket. The ground walls created by the ground mesh help to provide a more effective current return path for signals, thus lowering the inductance (L) of the PGA socket (by as much as 15% in some instances). For example, utilizing the PGA socket design with decoupling capacitors on the socket, loop inductance was reduced to 127 pH for 10 mm spacing between power and ground planes. Smaller spacing between planes reduced the loop inductance even more.

In addition, the ground walls help to control Zo of the PGA socket through a consistent ground spacing between signals. For a typical application, the Zo target is between 28Ω-60 Ω while in a conventional PGA socket the Zo value is 80Ω-100%. With the new design, because of the reduction in Self L and the increase in Self C, Zo reduces approximately by half, giving results in the range of 40Ω-50Ω. The ground walls also help to reduce crosstalk (i.e., "xtalk") among signals and EMI radiation. Xtalk is significantly reduced through the reduction in capacitive mutual coupling as well as inductance mutual coupling. For capacitive coupling, the various cases modeled showed that the Cmutual reduced from 0.2 pF to 0.9 fF (which is practically zero). The effect is similar for power delivery, because there is higher coupling between power and ground pins through the ground walls.

Figure 5A:
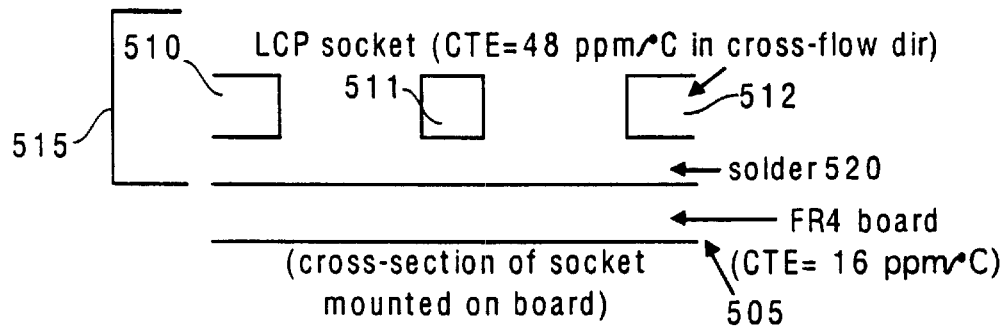
FIG. 5A is a cross-sectional view of a conventional PGA socket mounted to a motherboard.

Referring now to FIG. 5A there is shown a cross-sectional view of a conventional PGA socket mounted to a motherboard in accordance with one embodiment of the present invention. IC signal pins 510, 511, and 512 are inserted into multiple insertion holes (not shown in this view) and are soldered 520 to the motherboard 505 in a manner well known in the art of microelectronic fabrication. In this instance, the motherboard 505 is an FR4 motherboard and the PGA socket 515 is comprised of LCP. The typical coefficient of thermal expansion (CTE) mismatch between the PGA socket 515 and the FR4 motherboard 505 is 32 ppm/° C. (with the CTE of the PGA socket 515 being 48 ppm/° C. and the CTE of the FR4 motherboard 505 being 16 ppm/° C.). The difference in CTE between the PGA socket 515 and the motherboard 505 can overstress, and subsequently crack, the solder connection 520 between the PGA socket 515 and the motherboard 505.

Figure 5B:
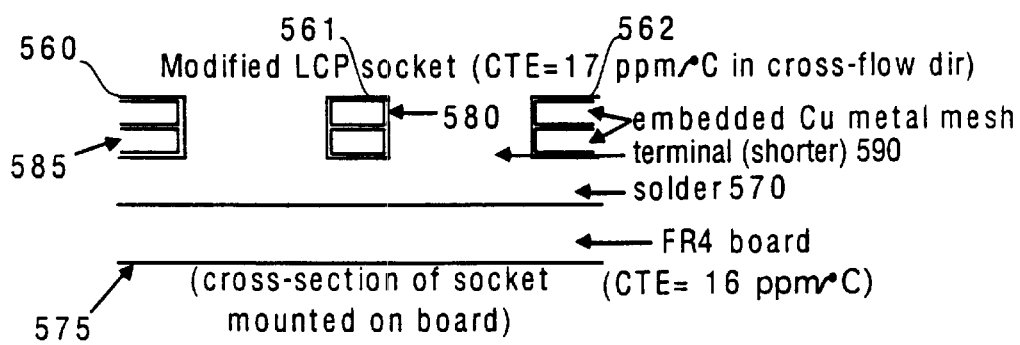
FIG. 5B is a cross-sectional view of embedded power and ground planes in a PGA socket mounted to a motherboard according to one embodiment of the present invention.

FIG. 5B is a cross-sectional view of embedded power and ground planes in a PGA socket mounted to a motherboard according to one embodiment of the present invention. As in the example illustrated by FIG. 5A above, IC signal pins 560, 561, and 562 are inserted into multiple insertion holes (not shown in this view) and are soldered 570 to the motherboard 575 (which, in this example, is an FR4 motherboard 575) in a manner well known in the art of microelectronic fabrication. Unlike the PGA socket of FIG. 5A, however, an embedded power plane 580 and an embedded ground plane 585 are added to the original LCP socket body as it is being formed. The power plane 580 and the ground plane 585 are fabricated from a metal mesh (e.g., Cu).

The metal mesh reduces the effective thermal expansion of the PGA socket in the LCP cross-flow direction which greatly improves the temperature cycle reliability of the PGA socket 590. The embedded metal mesh can reduce the CTE mismatch between the PGA socket 590 and the motherboard 575 to 1 ppm/° C. (which represents a 97% reduction in the typical CTE mismatch between a PGA socket and an FR4 motherboard).

This reduction in the CTE mismatch is particularly helpful for the process of temperature cycling, where PGA socket terminals are usually designed taller (and hence more compliant) to absorb the relative movement between the PGA socket and the motherboard without overstressing the solder connection between the socket and the motherboard. Thus, one benefit of the PGA socket 590 of the present scheme is the ability to use shorter, lower-inductance socket terminals because the CTE mismatch is greatly reduced. Another benefit of the embedded metal mesh is that warpage is reduced because the metal mesh is much stiffer than the LCP and can withstand the LCP residual stresses without warping. Small socket warpage allows large array sockets (up to 10,000 connections, potentially) to be surface mounted to standard FR4 motherboards.

Figure 6:
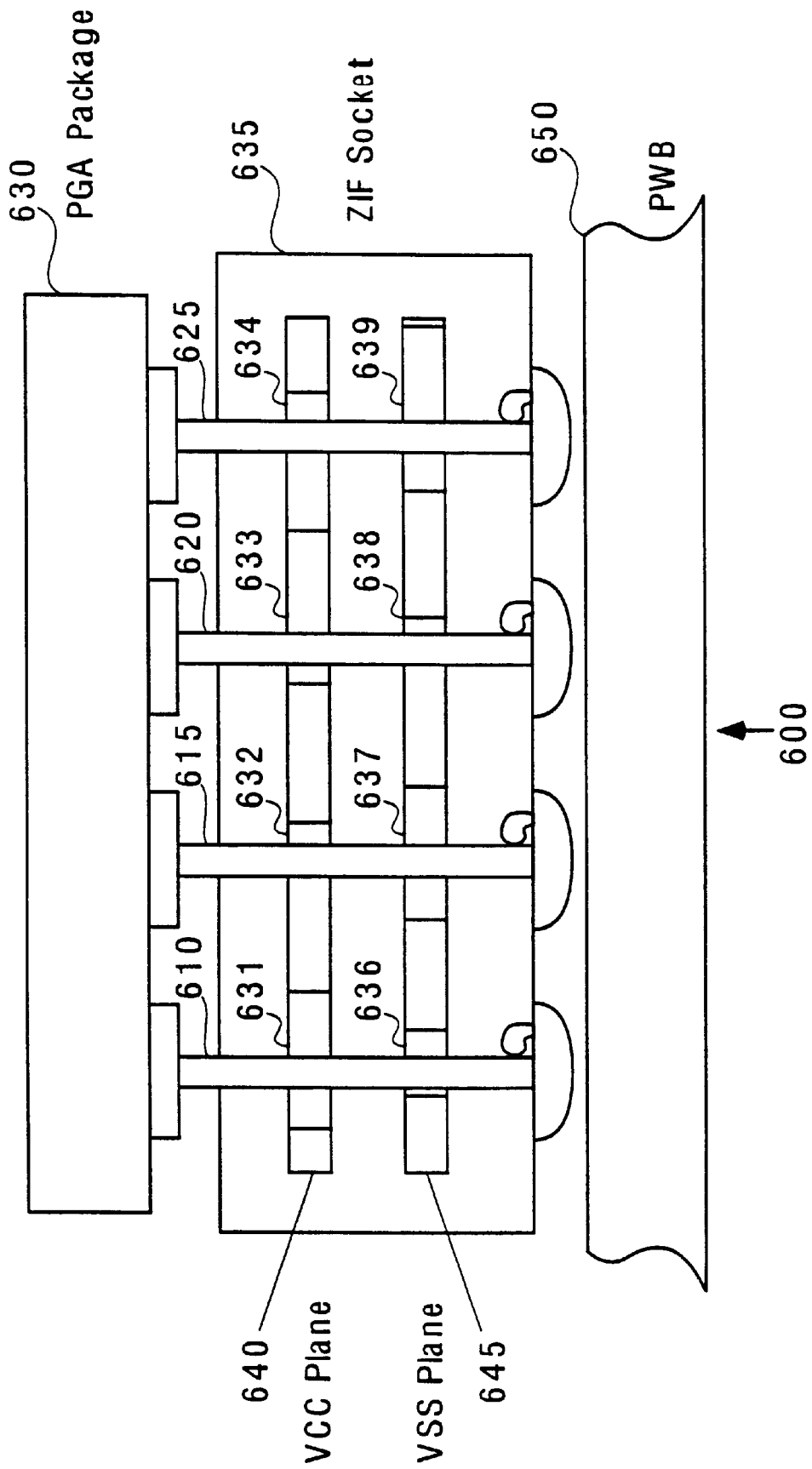
FIG. 6 is an exploded cross-sectional view of a microelectronic package substrate affixed to a motherboard with a PGA socket including embedded power and ground planes.

Referring now to FIG. 6 there is shown an exploded cross-sectional view of a microelectronic package substrate affixed to a motherboard with a PGA socket including embedded power and ground planes 600 according to one embodiment of the present invention. IC signal pins 610, 615, 620, and 625 protruding from a microelectronic package substrate 630 are inserted into multiple insertion holes in the PGA socket 635. Multiple insertion holes 631, 632, 633, and 634 in the power plane 640 overlap multiple insertion holes 636, 637, 638, and 639 in the ground plane 645. Pins 610 and 620 are ground pins and thus make contact with the ground plane 645 when the PGA socket 635 is mounted to the motherboard 650 in a manner previously described herein. Pins 615 and 625 are power pins and thus make contact with the power plane 640 when the PGA socket 635 is mounted to the motherboard 650. The pins 610, 615, 620, and 625 are soldered to the motherboard 650 in a manner well known in the art of microelectronic fabrication.

Referring now to FIG. 7 there is shown a chart of a CTE mismatch calculation between a PGA socket with embedded power and ground planes and a motherboard 700 according to one embodiment of the present invention. The CTE of the PGA socket with embedded power and ground planes is determined according to the following equation:

Where:

a=CTE

β=(x-section area of LCP socket)/(x-section are of metal mesh)=0.38 for two 0.4 mm thick sheets in 1.1 mm thick socket.

E=Young's Modulus or elastic stiffness of material $$a_{SOCKET}^{MODIFIED} = a_{LCP}\left[1 - \frac{\left(1 - \frac{a_{MESH}}{a_{LCP}}\right)}{\left(1 + \beta\left(\frac{E_{LCP}}{E_{MESH}}\right)\right)}\right] =$$

17 ppm/C for two 0.4 mm thick copper mesh sheets.

As the graph 700 indicates, there is a 1 ppm/° C. CTE mismatch between the PGA socket with embedded power and ground planes and the FR4 motherboard when the planes are fabricated from Cu and a 6 ppm/° C. CTE mismatch when the planes are fabricated from stainless steel. This is a significant improvement, as discussed above, over the typical 32 ppm/° C. CTE mismatch between a conventional PGA socket and an FR4 motherboard.

Thus, a system and method for a package socket with embedded power and ground planes has been described. Although the foregoing description and accompanying figures discuss and illustrate specific embodiments, it should be appreciated that the present invention is to be measured only in terms of the claims that follow.

What is claimed:

1. A method of fabricating an integrated circuit socket, the method comprising:

providing a base including a plurality of insertion holes;

providing a cover including a plurality of insertion holes corresponding to the insertion holes in the base, the cover slidably attached to the base;

embedding a plurality of power and ground planes in the socket, the power and ground planes fabricated from conductive metal mesh material; and affixing decoupling capacitors to the socket.

2. The method of claim 1 wherein embedding the plurality of power and ground planes in the socket further comprises providing a plurality of insertion holes of varying dimensions in the power and ground planes corresponding to the plurality of insertion holes in the base and the cover.

3. The method of claim 2 further comprising inserting integrated circuit power and ground pins into the plurality of insertion holes in the power and ground planes, the power pins inserted into insertion holes in the power plane that are smaller than corresponding insertion holes in the ground plane and the ground pins inserted into insertion holes in the ground plane that are smaller than corresponding insertion holes in the power plane.

4. The method of claim 3 further comprising affixing the base to a motherboard.

5. The method of claim 4 further comprising sliding the cover of the socket such that the power pins make contact with the power plane but not with the ground plane, ground pins make contact with the ground plane but not with the power plane, and signal pins avoid contact with both the power and ground planes.

6. A method for fabricating a pin grid array (PGA) socket for affixing an integrated circuit to a motherboard, the method comprising:

providing a base;

providing a cover including a plurality of insertion holes corresponding to a plurality of insertion holes in the base, the cover slidably attached to the base;

embedding a power and ground plane in the socket, the power and ground plane fabricated from conductive metal mesh material;

inserting integrated circuit pins into a plurality of insertion holes of varying dimensions in the power and ground planes, the plurality of insertion holes in the power and ground planes corresponding to the insertion holes in the cover and the base;

sliding the cover of the socket such that power pins touch the power plane and ground pins touch the ground plane; and affixing decoupling capacitors to the socket.

7. The method of claim 6 wherein inserting integrated circuit pins into the plurality of insertion holes in the power and ground planes comprises inserting power pins into insertion holes in the power plane that are smaller than corresponding insertion holes in the ground plane and inserting ground pins into insertion holes in the ground plane that are smaller than corresponding insertion holes in the power plane.

8. The method of claim 6 wherein inserting integrated circuit pins into the plurality of insertion holes in the power and ground planes further comprises inserting signal pins into one or more of the insertion holes in the power and ground planes.

9. The method of claim 6 wherein providing the base further comprises soldering the base to the motherboard.

* * * * *

UNITED STATES PATENT AND TRADEMARK OFFICE
CERTIFICATE OF CORRECTION

PATENT NO.   : 6,584,685 B2
DATED        : July 1, 2003
INVENTOR(S)  : Chung et al.

It is certified that error appears in the above-identified patent and that said Letters Patent is hereby corrected as shown below:

Column 1,
Line 44, delete "modem", insert -- modern --.

Signed and Sealed this

Thirtieth Day of September, 2003

JAMES E. ROGAN
*Director of the United States Patent and Trademark Office*